(12) United States Patent
Kendall et al.

(10) Patent No.: US 7,007,131 B2
(45) Date of Patent: *Feb. 28, 2006

(54) METHOD AND APPARATUS INCLUDING SPECIAL PROGRAMMING MODE CIRCUITRY WHICH DISABLES INTERNAL PROGRAM VERIFICATION OPERATIONS BY A MEMORY

(75) Inventors: Terry L. Kendall, Diamond Springs, CA (US); Paul D. Ruby, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 415 days.

This patent is subject to a terminal disclaimer.

(21) Appl. No.: 09/752,594

(22) Filed: Dec. 27, 2000

(65) Prior Publication Data

US 2002/0080652 A1 Jun. 27, 2002

(51) Int. Cl.
*G06F 12/00* (2006.01)

(52) U.S. Cl. .............. 711/103; 365/185.01; 365/201; 714/718

(58) Field of Classification Search ............. 711/103; 365/201, 185; 714/718
See application file for complete search history.

(56) References Cited

U.S. PATENT DOCUMENTS

| 4,701,745 A | 10/1987 | Waterworth ............... 341/67 |
| 4,819,204 A | 4/1989 | Schrenk .................. 711/164 |
| 4,970,727 A * | 11/1990 | Miyawaki et al. ......... 714/720 |
| 5,016,009 A | 5/1991 | Whiting et al. ........... 341/67 |
| 5,053,990 A | 10/1991 | Kreifels et al. ........... 711/103 |
| 5,333,300 A | 7/1994 | Fandrich ................. 711/103 |
| 5,412,793 A | 5/1995 | Kreifels et al. .......... 365/185.33 |
| 5,434,819 A | 7/1995 | Matsuo et al. ........... 365/189.07 |
| 5,448,712 A | 9/1995 | Kynett et al. ............ 711/103 |
| 5,506,803 A * | 4/1996 | Jex ...................... 365/185.23 |
| 5,509,134 A | 4/1996 | Fandrich et al. .......... 711/103 |
| 5,526,311 A | 6/1996 | Kreifels et al. .......... 365/201 |
| 5,559,971 A | 9/1996 | Hsieh et al. ............. 710/317 |
| 5,600,600 A * | 2/1997 | Olivo et al. ............. 365/201 |
| 5,692,138 A | 11/1997 | Fandrich et al. .......... 711/103 |
| 5,701,266 A * | 12/1997 | Fazio et al. ............. 365/185.03 |
| 5,729,489 A | 3/1998 | Fazio et al. ............. 365/185.03 |
| 5,796,746 A | 8/1998 | Farnworth et al. ........ 714/718 |
| 5,873,113 A | 2/1999 | Rezvani ................. 711/103 |
| 5,974,499 A | 10/1999 | Norman et al. .......... 711/103 |
| 6,212,646 B1 * | 4/2001 | Miwa et al. ............. 711/103 |

OTHER PUBLICATIONS

"Simplify Manufacturing by Using Automatic Test-equipment for On-Board Programming," Intel Corporation, AP-629 Application Note, pp 1-15, Dec. 1998.

(Continued)

*Primary Examiner*—Christian P. Chace
(74) *Attorney, Agent, or Firm*—Blakely, Sokoloff, Taylor & Zafman LLP

(57) ABSTRACT

A method wherein a special programming mode of a memory is entered and internal program verification by the memory is disabled. An apparatus is also described having a host processor and a memory with special programming mode circuitry. The memory includes automation circuitry for program verification. A plurality of words is programmed into the memory without the memory performing internal program verification. The special programming mode is exited and internal program verification by the memory is enabled. The special programming mode may use hashing to optimize testing for a memory such as a non-volatile flash memory.

18 Claims, 13 Drawing Sheets

OTHER PUBLICATIONS

"3 Volt Fast Boot Block Flash memory 28F800F3 and 28F160F3," Intel Corporation, Doc#290644-005, pp 1-46, Jan. 2000.

"Improving Programming Throughput of Automated Flash Memories," Intel Corporation, AP-678 Application Note, pp 1-22, Dec. 1998.

Donald E. Knuth, "The Art of Computer Programming" from *Sorting and Searching*, pp. 506-515, vol. 3, Addison-Wesley Publishing Company, Reading, MA.

International Search Report, PCT US01/44877, Nov. 28, 2001.

* cited by examiner

METHOD AND APPARATUS INCLUDING SPECIAL PROGRAMMING MODE CIRCUITRY WHICH DISABLES INTERNAL PROGRAM VERIFICATION OPERATIONS BY A MEMORY

RELATED APPLICATIONS

This application is related to U.S. patent application Ser. No. 09/748,825, filed Dec. 26, 2000 and U.S. patent application Ser. No. 09/749,133, filed Dec. 26, 2000.

FIELD OF THE INVENTION

The present invention relates to the field of testing semiconductor memories. More particularly, the present invention relates to a special programming mode for a semiconductor memory that uses hashing to help to optimize testing of a semiconductor memory.

BACKGROUND OF THE INVENTION

Over the years, different programming methods have been developed to program nonvolatile memory. FIG. 1 shows prior art programming algorithm 10 for a prior art nonvolatile erasable programmable read-only memory ("EPROM") that does not include on-chip program and erase automation circuitry. A microprocessor coupled to the EPROM executes programming algorithm 10. The microprocessor sends a 100 microsecond programming pulse to the EPROM. The microprocessor then performs a word verification to determine if the word intended to be programmed into the EPROM has been successfully programmed. The algorithm terminates if 25 attempts fail to program a word. On the other hand, if the word was successfully programmed, then the algorithm repeats as it steps through each address.

FIG. 2 shows prior art programming algorithm 15 for a prior art early-generation flash nonvolatile memory. A microprocessor coupled to the prior art flash memory executes programming algorithm 15. The flash memory is programmed on a word-by-word basis. The microprocessor writes a program command to the flash memory with a 10 microsecond time out. Thus, the programming operation takes 10 microseconds.

Following each programming operation, each word just programmed is verified by the microprocessor. The program verify operation is initiated by the microprocessor writing a program verify command into a command register of the flash memory. The program verify operation stages the flash memory for verification of the word last programmed. The flash memory applies an internally-generated margin voltage to the word. The microprocessor then performs a read cycle to output the word from the flash memory to the microprocessor. The microprocessor then compares the data word read from the flash memory to the data word that the microprocessor intended to program into the flash memory. A successful comparison between the programmed word and the time data means that the word was successfully programmed. If the data was not successfully programmed, then the program and verify steps are repeated with a limit of 25 attempts to program the word.

FIG. 3 shows a prior art programming algorithm 18 for a later-generation prior art flash memory that includes on-chip program and erase automation circuitry. The on-chip program and erase automation circuitry includes a command user interface, a write state machine, a data comparator, and a status register.

The programming algorithm 18 begins with the microprocessor coupled to the flash memory writing a program setup command (i.e., 40 Hexadecimal) to the command user interface of the flash memory followed by a second write operation that specifies the address and data. After successful receipt and interpretation of the requested program operation, the command user interface of the flash memory forwards a translated signal to the write state machine of the flash memory then takes over, controlling an internal program algorithm within the flash memory. In particular, the write state machine supervises internal program and verify circuits to perform the following tasks: (1) program pulse control, (2) pulse repetition control, (3) time-out control, (4) program verification, and (5) status register update.

Assuming the memory location to be written to had been previously erased (i.e., stores all logical ones), in order to program the word in the flash memory array, the write state machine sends a programming pulse of a predetermined width to those memory cells that need to be programmed from a one to a zero.

Program verification then occurs in two steps. A margined-sensing read voltage is applied to the just-programmed cells. The resulting bit line currents are then fed individually to sense amplifiers, one sense amplifier per cell. The outputs of factory-set program reference circuits, adjusted to $V_{tp}$ (i.e., the program threshold voltage), are also fed into the respective sense amplifiers. The outputs of the sense amplifiers are then routed into a data comparator for collation. This collation compares the outputs of the sense amplifiers to the contents of a data register.

The data comparator reports the results of its collation to the write state machine, which in turn determines if pulse repetition is required. If the program verification operation shows that one or more cells need to be reprogrammed, the above program and program verification steps are repeated until either all the cells are verified as successfully programmed or a time-out occurs. When pulse repetition ends, the write state machine sends a signal to update the status register.

Bit seven of the status register (i.e., SR.7) is set to zero when the write state machine is busy. Bit seven of the status register is set to one when the write state machine is done (such as when programming ends) and is ready to perform the next operation. If bit four of the status register (i.e., SR.4) is set to one, that indicates that an error occurred in programming the word.

If the address at which the data word was programmed is not the last address, then the external microprocessor increments the address and repeats the above operations. In other words, the microprocessor sends the memory a 40 Hex program setup command followed by a write operation that specifies the incremented address and the associated data word. The memory programs the data word, performs internal program verification, and updates the status registers. The above process is repeated until all the data words are programmed.

Although prior art on-chip program verification is generally advantageous because the external microprocessor is freed to do other tasks, on-chip program verification has some disadvantages. With on-chip program verification, voltages are continuously being slewed from low to high levels and vice-versa, which generally lengthens programming times. Moreover, voltage and timing settings for the program and program verification operations are often chosen to handle worst case conditions, which also generally lengthens programming times. Furthermore, a program command precedes each data word to be programmed, further increasing programming times for long strings of data words.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A special programming mode is described for testing a semiconductor memory, such as a flash nonvolatile memory. The special programming mode is also referred to as the factory programming mode, given that the mode would often be employed in a factory setting involving the testing of a semiconductor memory after it had been fabricated and packaged.

As will be described in more detail below, for one embodiment a host computer—such as a microprocessor—is coupled to a flash nonvolatile memory. The microprocessor sends one or more commands to the flash memory to enter the special programming mode. During the special programming mode, the flash memory cells are programmed without the use of internal data verification by the flash memory.

The flash memory programming operations are optimized for speed. The host microprocessor can permanently disable future entry into the factory programming mode by sending a disable factory programming mode command to the flash memory.

Embodiments of the invention help to reduce the time it takes to test a flash memory to see if the flash memory can be successfully programmed. A reduction in testing time of a flash memory can help to increase the overall efficiency of manufacturing products containing flash memories, especially at high volumes. Embodiments of the invention help to optimize data programming of a flash memory.

Figure 4:
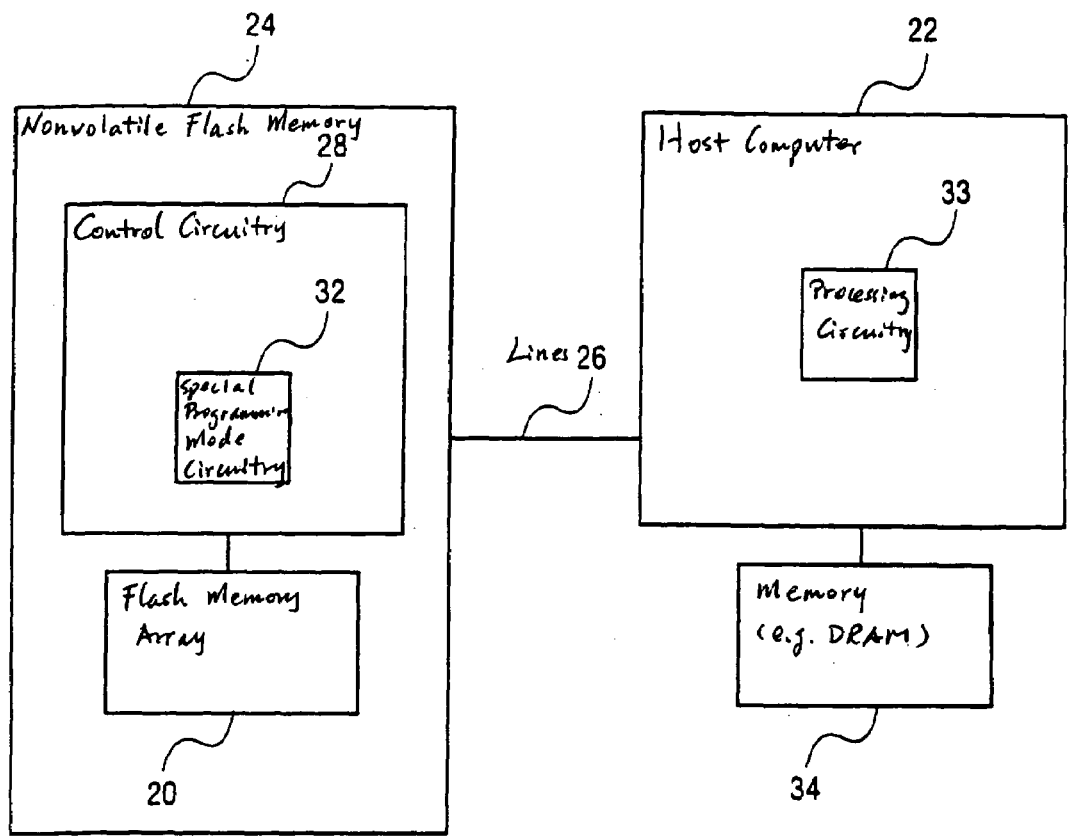
FIG. 4 shows a host processor coupled to a flash nonvolatile memory in accordance with an embodiment of the invention.

FIG. 4 shows an arrangement of components for a special programming mode operation, also referred to as a factory programming mode operation. Host computer 22 is coupled to a nonvolatile flash memory 24 via lines 26. Lines 26 include busses that transmit address, control, and data signals. Host computer 22 can be a microprocessor or other computing means, such as a microcontroller, a personal computer, a personal digital assistant, a network processor, a workstation, or a mainframe computer. Host processor 22 oversees the testing of flash memory 24. Although for one embodiment of the invention, memory 24 is flash memory, other types of semiconductor memory can be used. In addition, for other embodiments of the invention, memory 24 can be embedded in a chip or device containing other circuitry. For example, memory 24 can be embedded in a system-on-a-chip containing digital and analog circuitry as well as other memory.

Host processor 22 includes processing circuitry 33 for using a special programming mode to program memory 24. The special programming mode allows host processor 22 to send data words for programming by memory 24 and allows memory 24 to enter a special programming mode, wherein data verification is done externally by host processor 22. Circuitry 33 of host processor 22 includes circuits for performing external data verification during the special programming mode.

Host processor 22 is also coupled to memory 34 for storing code and data for processor 22. The code stored in memory 34 includes the algorithm used by host processor 22 to test memory 24. That memory test algorithm includes an algorithm for programming memory 24 that relies on external programming verification by host processor 22. Memory 34 also stores data to be used by host processor 22. That data used by host processor 22 includes data to be programmed into memory 24. Host processor 22 also uses memory 34 as a scratch pad to store data read from memory 34 as part of the external program verification routine executed by host processor 22.

For one embodiment, memory 34 is DRAM (dynamic random access memory). For other embodiments, other types of semiconductor memory can be used. For yet other embodiments, memory 34 can comprise hard disk memory or nonvolatile memory. For one embodiment, memory 34 is external to host processor 22. For other embodiments, memory 34 can be included as part of host processor 22, forming a system on a chip, for example.

For one embodiment, memory 24 is a flash nonvolatile memory that includes write automation circuitry. Memory 24 includes control circuitry 28 that is coupled to a flash memory array 20. Control circuitry 28 includes special programming mode circuitry 32 that allows memory 24 to enter or exit a special programming mode. During the special programming mode, internal data verification by memory 24 is disabled temporarily and external data verification occurs externally through the use of host processor 22. Flash memory array 20 includes individual flash memory cells for nonvolatile storage of information.

Figure 5:
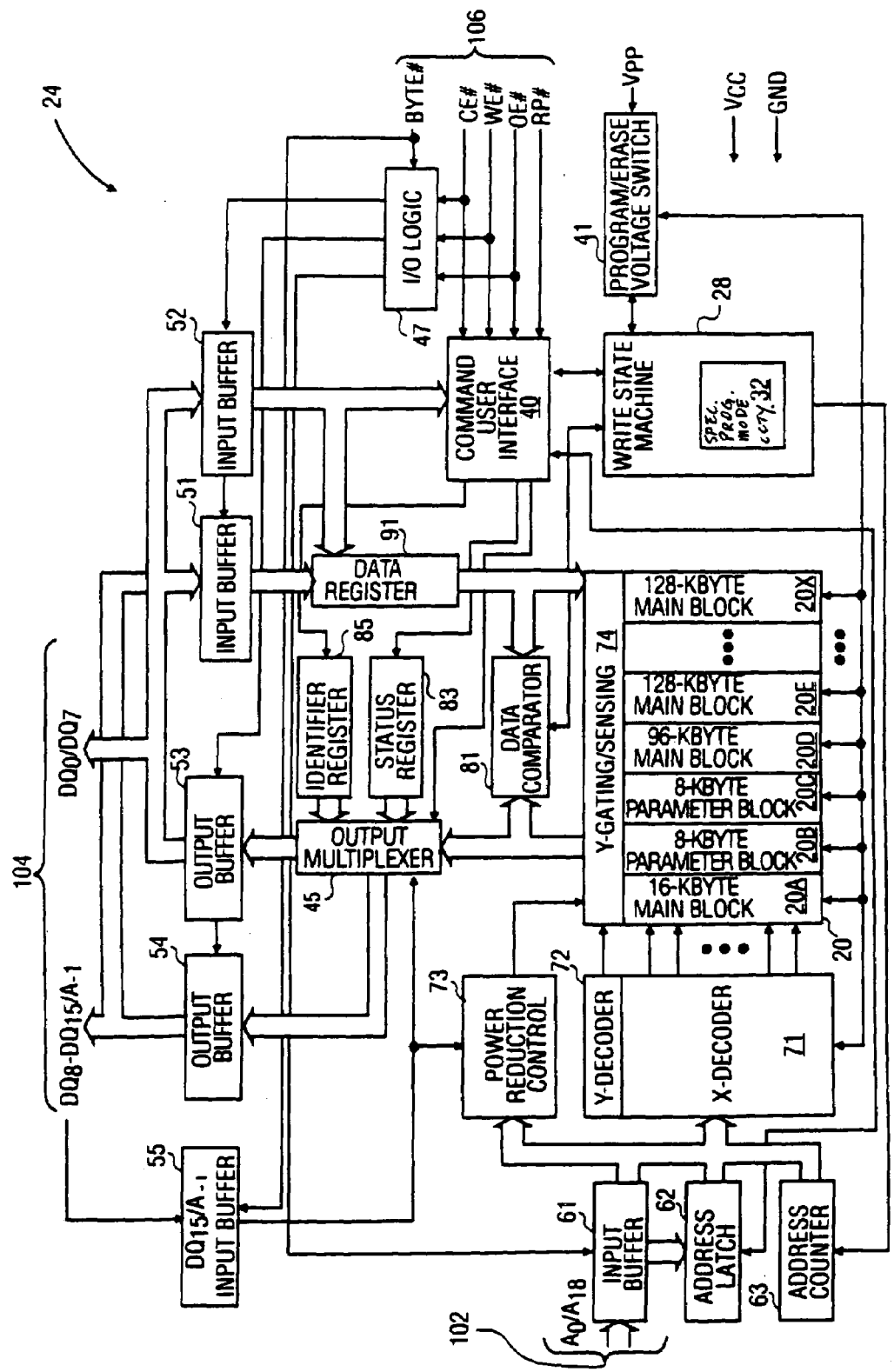
FIG. 5 is a block diagram of a flash nonvolatile memory that includes special programming mode circuitry.

FIG. 5 shows more details of flash nonvolatile memory 24. Flash memory 24 is comprised of a flash cell array 20, command user interface circuitry 40, write state machine 28, special programming mode circuitry 32, input/output logic 47, input buffers 51, 52, and 55, output buffers 53 and 54, output multiplexer 45, identifier register 85, status register 83, data register 91, data comparator 81, address input buffer 61, address latch 62, address counter 63, power reduction control circuitry 73, X decoder 71, Y decoder 72, program/erase voltage switch 41, and Y gating/sensing circuitry 74.

The flash cell array 20 provides random access nonvolatile large-scale data storage. For one embodiment, the flash cell array 20 is arranged as a set of array blocks 20a–20x. Block 20a is a 16 kilobyte main block. Block 20b is a 8 kilobyte parameter block. Block 20c is a 8 kilobyte parameter block. Block 20d is a 96 kilobyte main block. Block 20e is a 128 kilobyte main block. And block 20x is a 128 kilobyte main block. Other 128 kilobyte main blocks of flash array 20 are not shown.

Control bus 106 is part of data lines 26 of FIG. 4. Data bus 104 is also part of lines 26 of FIG. 4. Address bus 102 is part of lines 26, also. Address bus 102, data bus 104, and control bus 106 couple the flash memory device 24 to host processor 22.

Flash memory device 24 has on-chip program and erase automation circuitry that includes the command user interface 40, write state machine 28, data comparator 81, and status register 83.

The command user interface circuitry 40 is a request interface for flash memory device 24. The basic job of the command user interface circuitry 40 is to arbitrate between host processor 22 and internal flash memory device 24 functions. The command user interface 40 serves this role via a command register to hold the issued request, a command decoder to interpret/translate that request, and the control logic to initiate action. Activities include communications between command user interface 40 and write state machine 28, read path selection, and status register 83 checking and clearing.

The command user interface 40 resides on an internal data bus. Commands are input on data pins $DQ_0$–$DQ_7$ with CE# and WE# driven low. The commands get latched and interpreted after WE# is returned to $V_{IH}$. Address information is captured in the address latch 62 and program data is stored in the data register 91 when WE# is driven high in a second bus cycle.

When the issued command is a read operation (for example, from the identifier register 85, or the status registers 83, or the memory array 20), the command user interface 40 ensures that the output multiplexer 45 gates that data to the output buffers 53 and 54.

Write state machine 28 controls the different components within flash memory 24 needed to program, erase, and verify the array 20. The write state machine 28 comprises integrated oscillator and control circuitry to carry out program and erase operations. The write state machine 28 is a specialized reduced instruction set processor for performing program, erase, and other operations on array 20. The write state machine 28 includes an arithmetic logic unit, general purpose registers, a control store, and a control sequencer. The write state machine 28 uses information received from the command user interface 40 to access the appropriate location of the program memory to execute instructions needed to perform an operation. Command user interface 40 to write state machine 28 signaling forwards translated user requests for processing and control. The write state machine 28 executes the implementation algorithms for sequencing the high voltage circuitry of Y gating/sensing circuitry 74 in order to apply charge to the flash cells of the array 20 and remove charge from the flash cells of the array 20.

The write state machine 28 generates signals that initiate a strobe to bits of array 20 requiring programming or to a block of array 20 to erase. The write state machine 28 also generates signals to supervise strobe pulse width and associated timings. The write state machine 28 generates signals that control the data comparator 81. The write state machine 28 generates signals that request feedback from the data comparator 81 to determine pulse repetition control and provide an update to the status register 83. The write state machine 28 generates signals that initiate an address counter 63 for erase preconditioning or erase verify.

The Y gating/sensing circuitry 74 comprises read/write path circuitry for accessing the array 20. More particularly, the Y gating/sensing circuitry 74 includes source switch circuitry for applying the appropriate voltage levels to the array 20 for an erase function. The Y gating/sensing circuitry 74 also includes program load circuitry for driving program level voltages onto the bit lines of array 20 during programming.

Host processor 22 reads the array 20 by transferring addresses over the user address bus 102 while signaling read cycles over the user control bus 106. The command user interface circuitry 40 detects the read cycle and causes the address latch 62 to transfer the addresses from the user address bus 102 through to the X decoder 71 and Y decoder 72. The command user interface circuitry 40 also causes the output multiplexer 45 to transfer the read data from the Y gating/sensing circuitry 74 over the user data bus 104.

The host processor 22 writes data to the array 20 generating write cycles over lines 26 (e.g., 102, 104, and 106) to transfer program commands and data to the command user interface circuitry 40. The command user interface circuitry 40 verifies the program commands, and queues the program commands, and address and data parameters, to the write state machine 28. The write state machine 28 performs the program operation by programming the specified data into the array 20 at the specified address.

Write state machine 28 includes circuitry 32 for enabling or disabling the special programming mode of flash memory 24. When the special programming mode is enabled by circuitry 32, the write state machine 28 prevents the internal verification of data written to memory array 20. Verification of program data is a normal operation of flash memory 24.

Write state machine 28 includes circuitry 32 for enabling or disabling the special programming mode of flash memory 24. When the special programming mode is enabled by circuitry 32, the write state machine 28 prevents the verification of data written to memory array 20. Verification of program data is the normal operation of flash memory 24.

Figure 6:
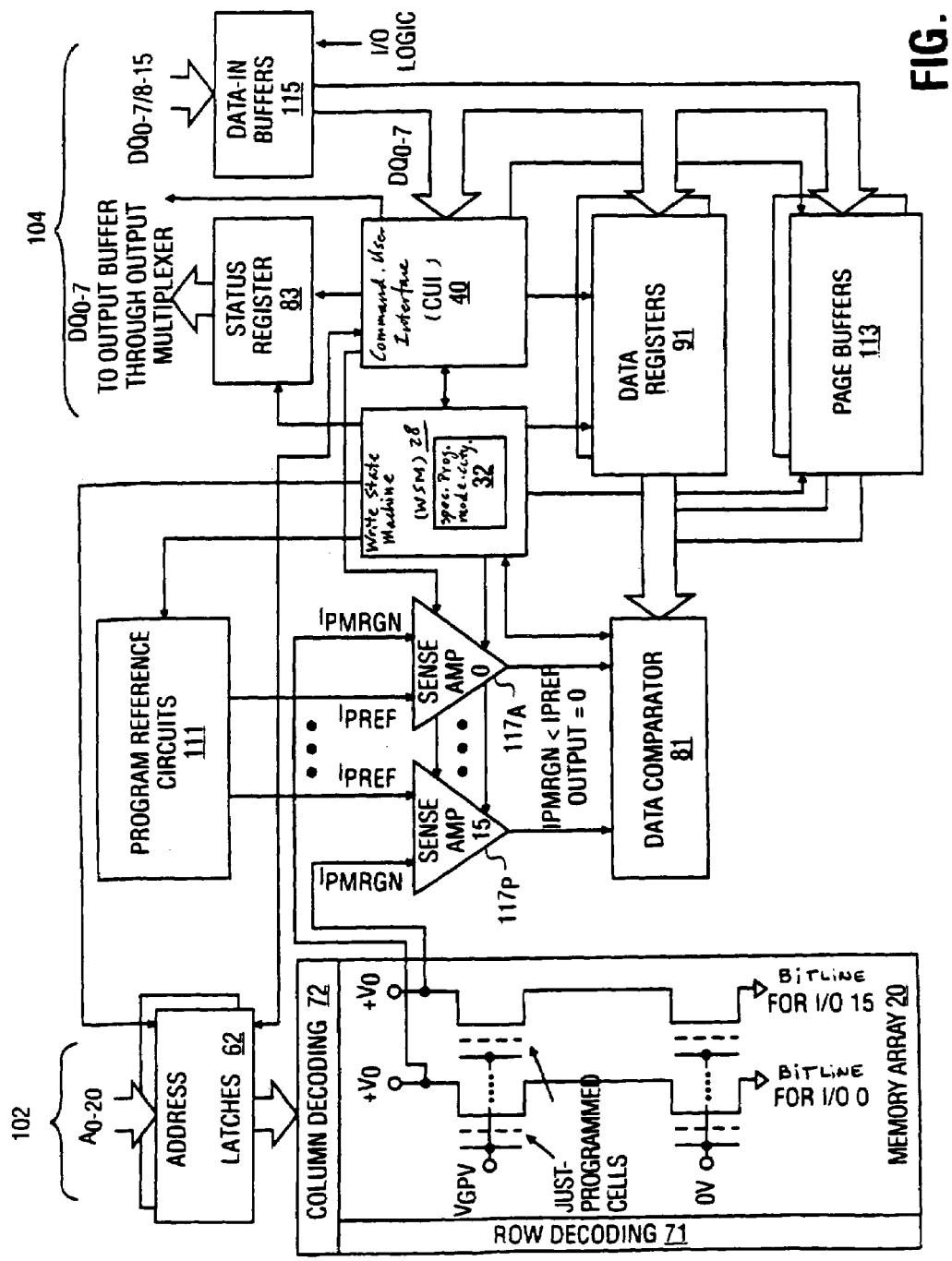
FIG. 6 shows flash memory circuitry associated with program verification and the special programming mode.

The normal verification operation of flash memory 24 is explained as follows with reference to FIGS. 5 and 6. FIG. 6 shows certain circuitry of flash memory 24 in more detail. Data comparator 81 is central to the normal program verification operation by flash memory 24. Data comparator 81 is controlled by the write state machine 28. The write state machine 28 employs the data comparator 81 during program verification and erase verification operations. The data comparator 81 collates just-programmed cells of array 20 against data stored in the device data register 91. For erase verification, data comparator 81 compares erased locations against the data value FFFF hexadecimal. Erased locations are cycled through the data comparator 81 via address counter circuit 63.

For program verification and erase verification, the data comparator 81 reports the results of its collation to the write state machine 28, which in turn determines if pulse repetition is required. If pulse repetition is not required, the write state machine 28 sends a signal to update the status register program or erase status bit, which is reflected in status register 83.

For normal program verification, a margining function occurs just ahead of the data comparison done by data comparator 81. For program verification, current $I_{PMRGN}$, derived from a program margin bias read of a column containing the program cell of array 20, is fed into one of the 16 sense amplifiers 117a–117p (assuming a 16 bit word) with reference current $I_{PREF}$, which is the current from a factory-set program reference circuit 111. The margin current $I_{PMRGN}$ is derived from an elevated read voltage applied to the just programmed cell.

If $I_{PMRGN}$ is less than $I_{PREF}$, then the particular sense amplifier of sense amplifiers 117A–117P outputs a logical one. This operation occurs for eight or sixteen bits in parallel, depending on the bus width of the program operation. The eight bit or sixteen bit output values from the sense amplifiers 117A–117P are sent to the data comparator 81 for collation against data stored in data register 91.

Special programming mode circuitry 32 of write state machine 28 shown in FIG. 5 can disable the program verification procedure used by write state machine 28. Circuitry 32 can either temporarily disable the program verification by write state machine 28 or permanently disable program verification by write state machine 28. For one embodiment of the invention, circuitry 32 comprises code stored in array 20 and associated circuitry that acts to disable the program verification procedure within flash memory 24. The program verification procedure can be either disabled temporarily for the programming of certain data words, or the program verification procedure can be permanently disabled to prevent an outside user of memory 24 from entering the special programming mode. During the special programming mode, circuitry 32 disables program verification.

Status register 83 shown in FIG. 5 is another component in the automation circuitry of flash memory 24. Status register 83 is comprised of bits that are an interface to the outside world of flash memory 24. The write state machine 28 receives feedback from its support circuits, thereby allowing the write state machine 28 to keep the status register 83 current and the command user interface 40 abreast. Bit seven of the status register indicates whether the write state machine is ready to receive further commands (a logical one) or busy performing tasks (a logical zero). Bit four of the status register 83 indicates program status. If bit four of status register 83 is a logical one, that indicates an error in the word/byte programming. If the program status bit four is a logical zero, that indicates successful word/byte programming.

Status register contents are driven out on bits $DQ_0$–$DQ_7$ of data bus 104 at the failing edge of CE# or OE#, whichever occurs last in the read cycle. Either pin must be driven high, then low again, to send updated content to the output buffers 53 and 54. Host processor 22 then reads the output of status register 83 over data lines 104.

Figure 7:
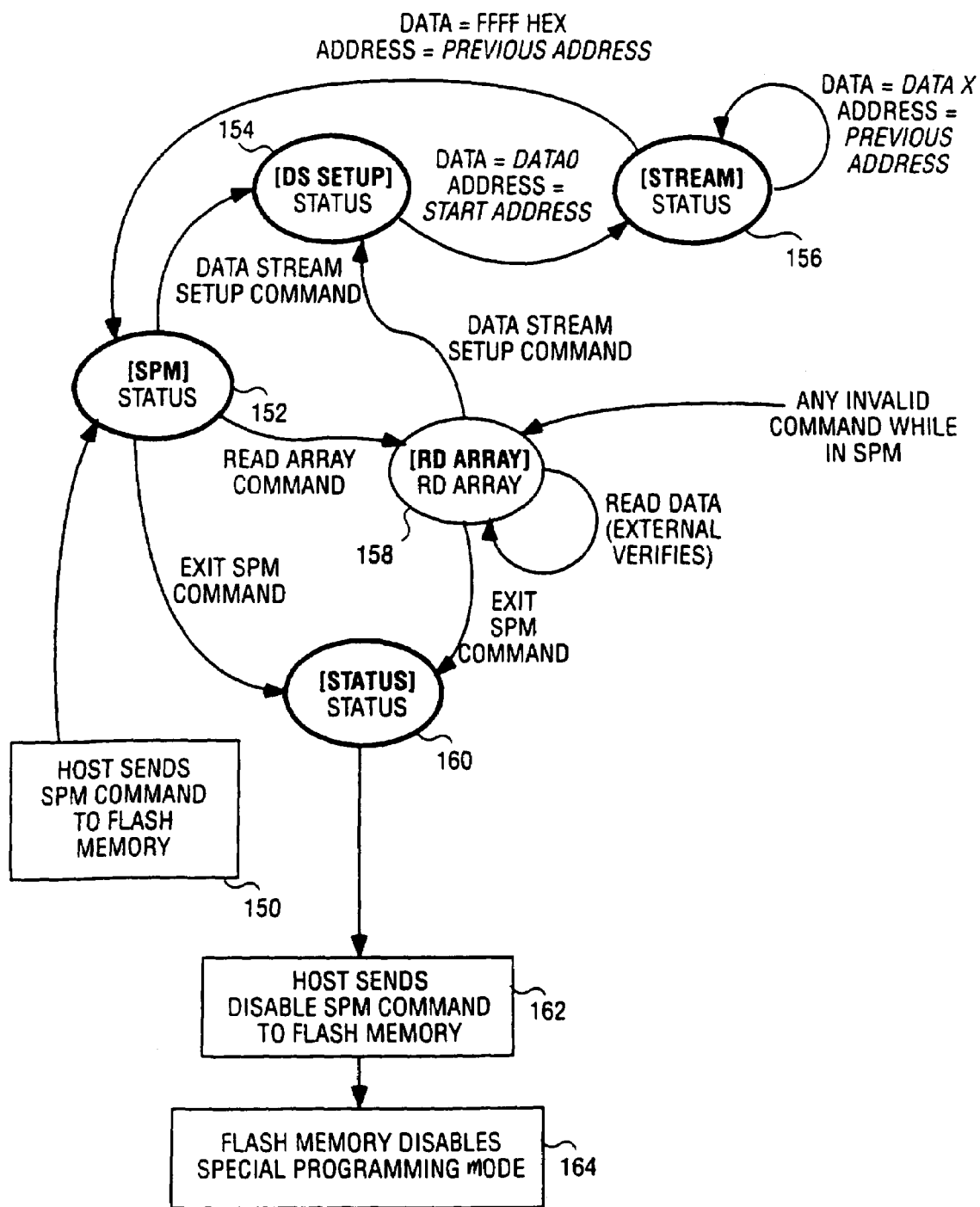
FIG. 7 illustrates the procedures for entering, exiting, and disabling a special programming mode for a flash memory.

FIG. 7 is a state diagram showing the procedures for entering, exiting, and disabling the special programming mode for flash memory 24. Bracketed information in FIG. 7 indicates the state of the command user interface 40. Information within the circles under the bracketed information indicates the state of output multiplexer 45 of flash memory 24.

The special programming mode procedure begins at operation or state 150, with the host processor 22 sending a special programming mode command to flash memory 24 via lines 26 to be stored in the command user interface 40. For one embodiment of the invention, a single special programming mode command is used to enter the special programming mode. For an alternative embodiment described in more detail below, a special sequence of commands is used in order to cause the command user interface to cause circuitry 32 to enter the special programming mode.

At state 152, the command user interface 40 has entered the special programming mode state. The output multiplexer 45 outputs a status signal. At state 152, the command user interface 40 causes circuitry 32 of write state machine 28 to enter the special programming mode. In the special programming mode, circuitry 32 disables internal program verification by flash memory 24.

Next, host computer 22 sends a data stream setup command to the command user interface 40 of flash memory 24 to get to state 154. At state 154, the command user interface 40 is in a data stream setup state (i.e., the DS setup state). At state 154, output multiplexer 45 outputs a status signal. The data stream setup state 154 causes the write state machine 28 to prepare flash memory 24 for a stream of data words to be programmed into flash memory array 20. For one embodiment, the stream of data words does not require sequential addresses. For another embodiment, the stream of data words is for sequential addresses. At state 154, the command user interface 40, the write state machine 28, and the special programming mode circuitry 32 are all in the data stream setup mode awaiting the input of data to be streamed into flash memory 24 for storage in array 20.

The next event to occur is that data is streamed from host processor 22 over data bus 104 to flash memory 24. For one embodiment of the invention, data bus 104 is 16 bits wide and each data word is accordingly a 16 bit wide data word. The data stream is a series of data words to be written into flash memory array 20 starting with the start address. For one embodiment, the stream of data words does not require sequential addresses. For another embodiment, the stream of data words is for sequential addresses. The start address is sent by host processor 22 over address bus 102 to flash memory 24. Once data is sent over data bus 104 to flash memory 24, flash memory command user interface 40 enters state 156, which is the data stream state. In state 156, the output multiplexer 45 outputs the status signal. At state 156, write state machine 28 and special programming mode circuitry 32 are also in the data stream state.

During the data stream state, a stream of data words are being sent to flash memory 24 from host processor 22 via data bus 104. The write state machine 28 and circuitry 32 cause the data stream words to be stored at addresses within flash memory array 20. For one embodiment, the addresses are not sequential. For that embodiment, the host processor 22 sends the various addresses over address bus 102 and does not continue to send the original address. For another embodiment, the address sent by host processor 22 over address bus 102 remains the original starting address. The write state machine 28 and circuitry 32 sequentially step through address counter 63 to cause the data words to be stored at a series of sequential addresses within flash memory array 20.

As shown in FIG. 7, the data that is sent equals data X, which indicates that a series of data words are being sent to flash memory 24. For one embodiment the address equals the previous address, which remains the start address of the data stream. For another alternative embodiment, however, various addresses can be sent. The command user interface 40, write state machine 28, and special programming mode circuitry 32 remain in the data stream state 156 until a data stream termination condition is encountered.

Figure 1:
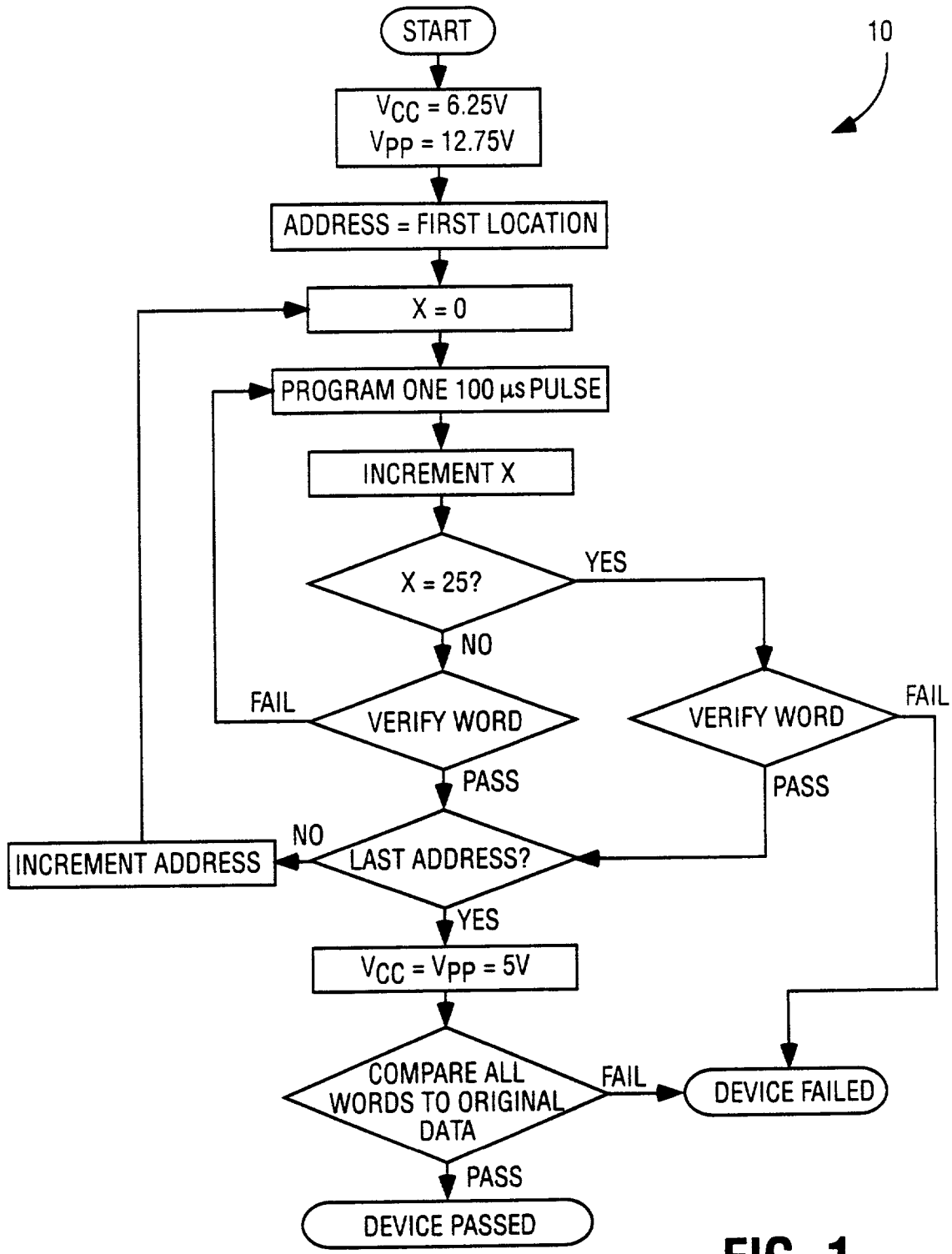
FIG. 1 illustrates a prior art programming algorithm for prior art EPROMs wherein an external microprocessor verifies the programming of each word.
Figure 2:
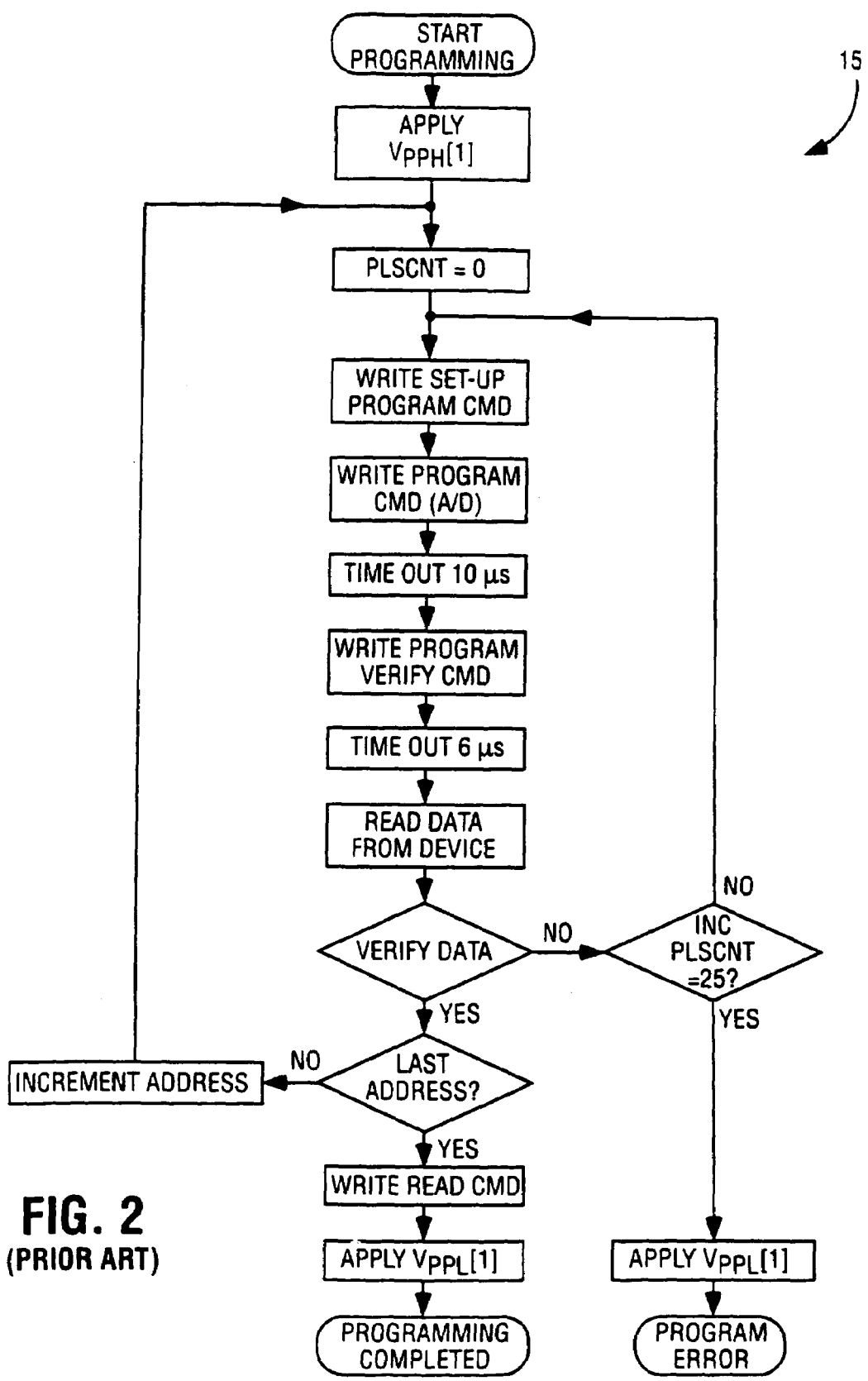
FIG. 2 shows a prior art programming algorithm for a prior art early-generation flash memory wherein program and program verify commands are used.
Figure 3:
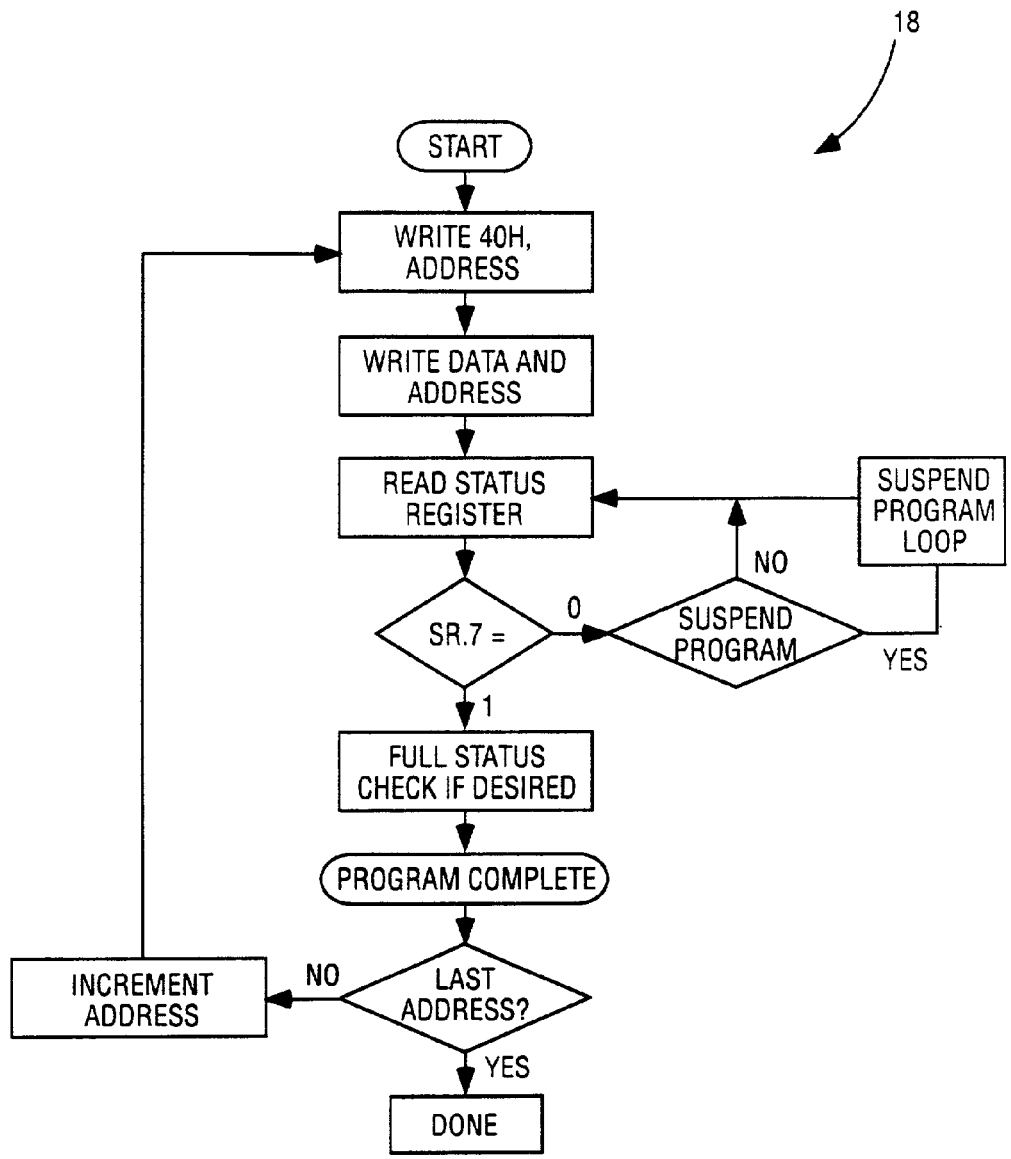
FIG. 3 shows a prior art programming algorithm for a later-generation prior art flash memory that includes on-chip program and erase automation circuitry.

The data stream state 156 differs from prior art programming operations. For prior art programming operations, such as the one shown in FIG. 3, for every data word in the data stream, there would be a program command 40 hexadecimal, followed by a single data word and address, followed by program verification. In other words, for the prior art to program a second data word at a second address, another programming command 40 hexadecimal would need to be sent to flash memory. The second data word and address would then be sent to the flash memory, and then a program verification operation would occur. Thus, for the prior art, the sequence command-data-verification, command-data-verification, command-data-verification, etc. would occur as the desired addresses are stepped through. For the prior art, after each word was verified as programmed, the write state machine would go into a "ready" state as indicated by bit seven of the status register being in a logical one state, assuming the data word was properly programmed.

In contrast, for the embodiment of the invention described with reference to FIG. 7, the write state machine 28 remains busy at state 156 until the entire stream of a plurality of data words is programmed into flash memory array 20. The "busy" state of write state machine 28 is indicated by a logical zero stored in bit seven of status register 83.

The special programming mode sequence described with reference to FIG. 7 assumes that the memory blocks that are to be programmed have been previously erased. For flash memory array 20, when a flash cell is erased the flash cell stores a logical one. When the flash cell is programmed, the flash cell stores a logical zero. To erase flash array 20, the flash array 20 must be erased a block at a time. In other words, a data block is the smallest unit of data that can be erased. When a data block is erased, each cell within that block is made to store a logical one. Individual bits or cells of flash memory array 20 can be programmed from the logical one state to the logical zero state. Nevertheless, individual bits cannot be programmed from the logical zero state to a logical one state. If one tries to program a bit or cell from a logical zero state to the logical one state without erasing the block, the individual cell will simply not respond (i.e., will not hold the charge or hold the state).

Figure 8:
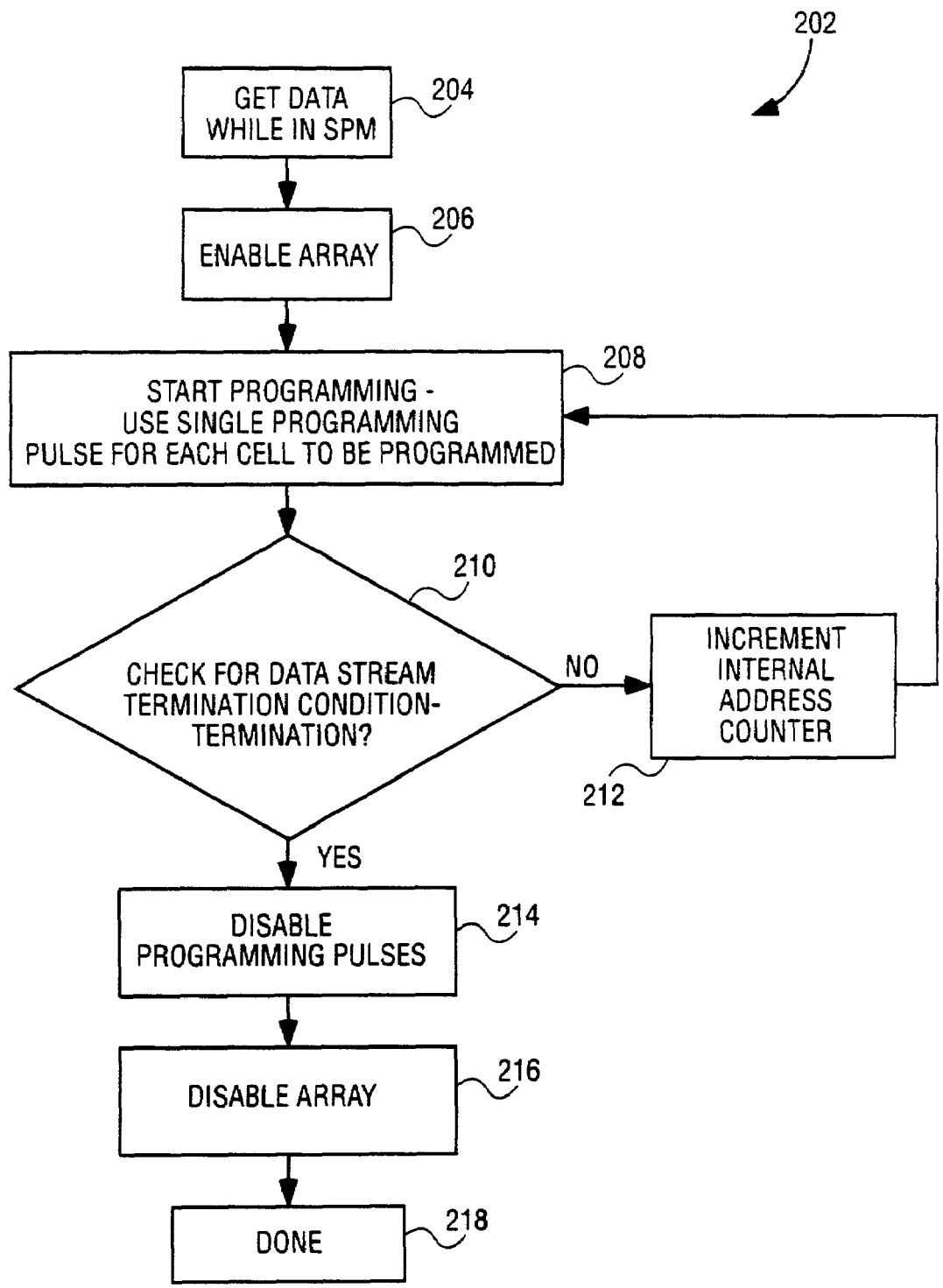
FIG. 8 illustrates the programming operation during the special programming mode.

FIG. 8 shows procedures 202 associated with the data streaming state 156 during the special programming mode. At process block 204, the flash memory 24 receives data over data bus 104 from host processor 22 while flash memory 24 is in the special programming mode. The data sent to flash memory 24 is a data stream that starts with a data word zero at a start address within flash memory array 20. At process block 206, the write state machine 28 and special programming mode circuitry 32 cause the flash memory array 20 to be enabled for programming.

At process block 208, the write state machine 28 begins the programming into array 20 of the first data word in the data stream being sent from host processor 22. Given the nature of flash memory, only those bits of the data word that are to be programmed from a logical one to a logical zero are actually programmed. Prior to programming, each bit in the block of the array 20 to be programmed is already in the logical one state (i.e., the FFFF hexadecimal state). Those bits that need to be changed from a one to zero are programmed by programming the respective cells.

At process block 208, only a single programming pulse is used for each cell to be programmed. In other words, during the special programming mode, multiple programming pulses are not sent to each cell, as would normally occur during a non-special programming mode operation. This helps to speed up the programming of the words. If the special programming mode is to be used for testing a flash memory 24 at the factory, the flash memory 24 will be newly fabricated, and thus a single programming pulse will usually be sufficient to successfully program a flash memory cell. This is in contrast to an older flash memory, which may require multiple programming pulses for a cell to be fully programmed in the normal programming mode.

At process block 210, the write state machine 28 and special programming mode circuitry 32 check for a data stream termination condition. This is done by checking the data bus 104 and the address bus 102 to see if the proper termination information is on those busses. If the data bus 104 and the address bus 102 continue to indicate that additional data words are being sent that are intended be programmed into flash memory 20, then process 202 moves to process block 212. At process block 212, the write state machine 28 increments internal flash memory address counter 63 to step to the next address. For one embodiment, the addresses are sequential. For an alternative embodiment, the addresses are not sequential and the host 22 sends various addresses. For that alternative embodiment, the address counter is not incremented. Instead, the next address is received from host 22. Program flow then returns to process block 208. The next word to be programmed is programmed into flash memory array 20 at the next address as indicated by internal address counter 63 for one embodiment. For another embodiment, the next address came from host 22. Process flow then continues to process block 210. The write state machine 28 and special programming mode circuitry 32 check again for the data stream termination condition by monitoring the data bus 104 and the address bus 102. If the data stream termination condition is not encountered, then the internal address counter 63 is again incremented by write state machine 28 at process block 212. For another embodiment, the next address instead comes from host 22. Process flow then continues to process block 208 and the next word in the data stream is programmed into flash memory array 20 by write state machine 28 and special programming mode circuitry 32. That word is programmed into the next address as indicated by the internal address counter 63. For another embodiment, the next address instead comes from host 22. Process flow then moves again to process block 210, where there is a check for the data stream termination condition.

The sequence of moving from process block 208 to process block 210 to process block 212 and back to process block 208 continues until all of the data words in the data stream are programmed.

The special programming mode circuitry 32 ensures that internal program verification is not done by flash memory 24 during the data stream during the special programming mode. Thus, the data stream being sent to flash memory 24 over lines 26 by host processor 22 is not interrupted by any commands being sent by host processor 22. In other words, host processor 22 does not send a separate program command for each word in the data stream to be programmed into flash memory 24. Nor does flash memory 24 perform an internal program verification for each data word being programmed into flash memory 24.

Various data stream termination conditions are possible for various embodiments. For one embodiment, the same address is sent on bus 102 during the data stream conditions. If the host processor 22 changes the address sent on address bus 102 coupled with a data word of FFFF hexadecimal, then that condition becomes the data stream termination condition. In other words, the write state machine 28 and special programming mode circuitry 32 check the address on address bus 102 and the data word on data bus 104, and if they see a changed address and a corresponding data word of FFFF hexadecimal, then they note that the data stream termination condition has been triggered. For a variation of that embodiment, the changed address need not be accompanied by a data word of FFFF hexadecimal to trigger a data termination condition.

For another embodiment that relies on the host 22 sending various addresses with data, the data termination condition can be the sending of a same address as the last address coupled with a data word of FFFF hexadecimal. For a variation of that embodiment, the same address need not be accompanied by a data word of FFFF hexadecimal to trigger a data termination condition.

For another embodiment of the invention, the data stream termination condition with respect to state 156 is the sending of a data word that is all logical ones on data bus 104 from the host processor 22 to the flash memory 24. In other words, the final data word in the data stream is specified as FFFF hexadecimal. For one embodiment of the invention, flash memory 24 is being tested during the special programming mode in the factory, so the test specifications set forth the requirement that the last data word in the data stream to be programmed for test purposes is a data word containing all logical ones.

For yet another embodiment of the invention, the test specifications require that the address on address bus 102 sent during the data stream increments for each memory word. In other words, the addresses increment as new data words are sent over data bus 104 from host processor 22 during this special programming mode data stream condition. For that embodiment, the data stream termination condition is triggered by an address on address bus 102 not incrementing coupled with a data word of FFFF hexadecimal. In other words, the end of the data stream is indicated by the address staying the same for the last data word in the data stream coupled with a data word of FFFF hexadecimal. The write state machine 28 and special programming mode circuitry 32 would check for such a data stream termination condition. For a variation of that embodiment, the condition of an address not incrementing world trigger a data termination condition even if not accompanied by a data word of FFFF hexadecimal.

As shown as FIG. 8, if the data stream termination condition is detected at process block 210, then process flow moves to process block 214. At process block 214, write state machine 28 and special programming mode circuitry 32 disable further programming pulses so no additional words are programmed into flash memory array 20. Process flow moves to process block 216, which causes the write state machine 28 and special programming mode circuitry 32 to disable array 20 from further programming. Process flow then moves to process block 218, at which point the programming of a stream of data words into flash memory array 20 ends.

For one embodiment of the invention, the block boundaries on flash memory array 20 do not act as data stream termination conditions. In other words, the data stream programming can continue across block boundaries within flash memory array 20. Therefore, programming of data words can continue uninterrupted even across flash block boundaries, assuming that each block has been previously erased.

Returning to FIG. 7, once the data termination condition is received by flash memory array 24, then the process flow moves from state 156 back to state 152. At state 152, the command user interface is in the special programming mode state and the output multiplexer 45 outputs a status signal. Even though the data stream has been programmed, the flash memory 24 remains in the special programming mode state. Nevertheless, up to this point there has been no internal verification by flash memory 24 of the successful programming of the data stream sent during step 156.

The next operation in the special programming mode process flow is to perform program verification external to flash memory 24. This external verification process flow is started by the host processor 22 sending a read array command to command user interface 40 over lines 26. As shown in FIG. 7, the read array command sent to the flash memory 24 causes the process flow to move to state 158. At state 158, the command user interface 40 is in the read array state (i.e., the RD Array state). The output multiplexer 45 outputs a read array signal. During state 158, the host processor 22 reads the data that had been programmed into flash memory array 20 during the data streaming during state 156. During state 158, the host computer 22 reads the data and verifies whether or not the streaming data words had been successfully programmed into array 20.

Figure 9:
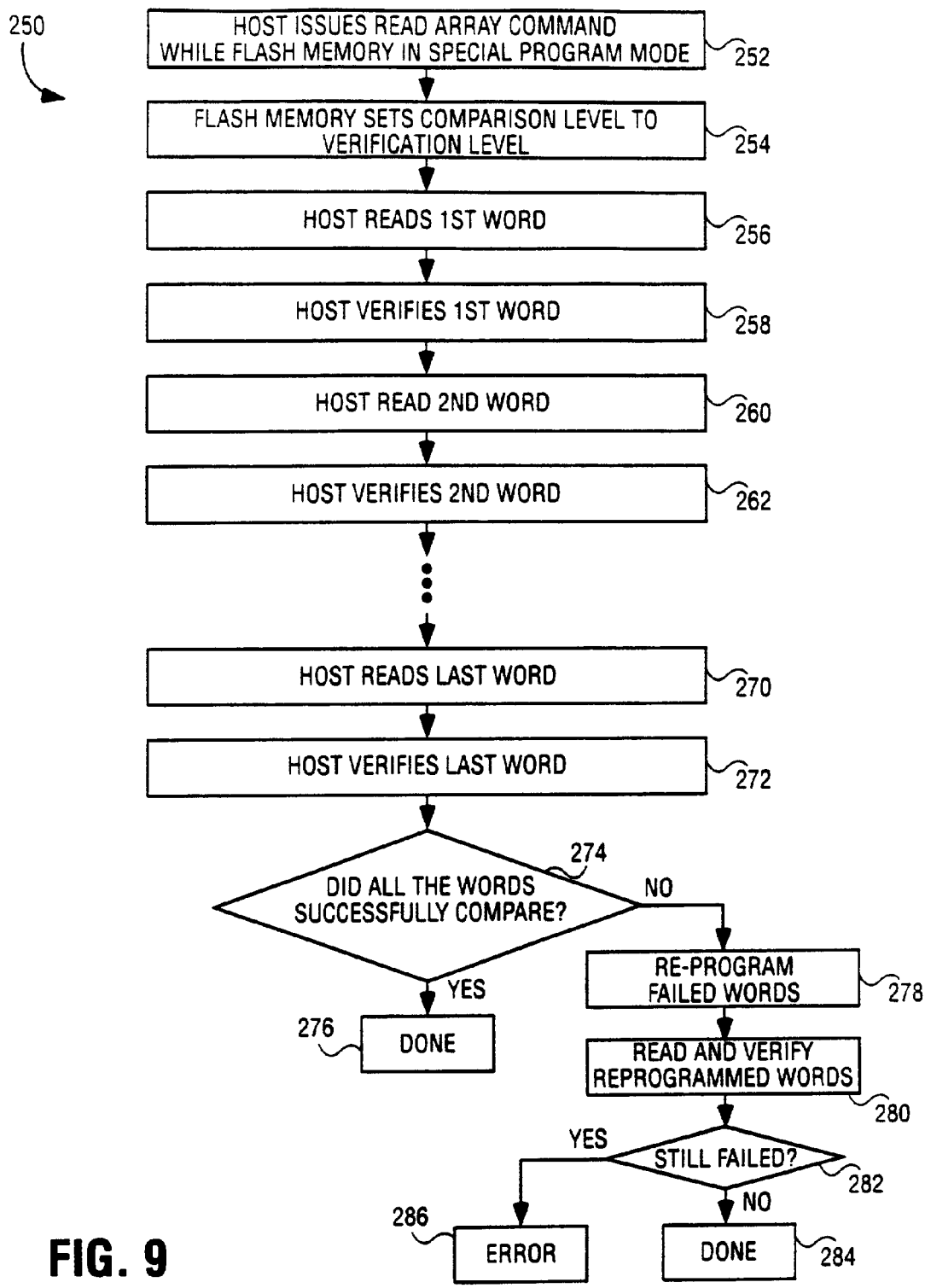
FIG. 9 shows the verification operations during the special programming mode.

FIG. 9 shows the procedures 250 for external program verification during the special programming mode of flash memory 24. At process block 252, the host processor 22 issues a read array command to command user interface 40 over lines 26. The process flow then moves to process block 254, at which point the flash memory 24 sets the data comparison level to the verification level.

At process block 254, instead of data comparator 81 performing an internal program verification with respect to the data word, the data word is not verified internally, even though sensing is done using a margined-sensing scheme. Process flow moves to process block 256. At process block 256, the host 22 will issue a read command to command user interface 40 to read one data word, which is the first data word in the data stream that has been programmed into flash memory array 20. Upon receipt of the read command from the host processor, the command user interface 40, the write state machine 28, and the special programming mode circuitry 32 will cause the first data word to be sent over data bus 104 to host processor 22.

The write state machine 28 and special programming mode circuitry 32 cause the read operation with respect to flash memory array 20 to occur at the program verification voltage levels. Thus, at process block 256, the write state machine 28 and special programming mode circuitry 32 cause a margined-sensing scheme to be used. An elevated read voltage is applied to the programmed cells. The current $I_{PMRGN}$, derived from a programmed margin bias read of the column containing the programmed cell, is fed into one of the sense amplifiers 117A–117P with reference current $I_{PREF}$, which is the current from the factory set program reference circuit 111. If $I_{PMRGN}$ is less than $I_{PREF}$, then the particular sense amplifier of sense amplifiers 117A–117P outputs a zero. If $I_{PMRGN}$ is greater than $I_{PREF}$, then sense amplifiers 117A–117P outputs a logical one. These operations occur for all the bits of the word in parallel, using each of the sense amplifiers 117A–117P.

Moving to process block 258, the host processor 22 performs a verification of the first data word externally. For one embodiment of the invention, the verification operation 258 is a comparison operation wherein the host processor 22 uses processing circuitry 33 to compare the data word received from flash memory array 24 with a memory word stored in memory 34. That memory word stored in memory 34 is the original word intended by host processor 22 to be stored into flash memory array 20. Host computer 22 thus uses memory 34 to store the data stream that host processor 22 sent to flash memory 24 as part of the data stream operation. That data in memory 34 is then compared with the data stored in flash memory array 22 in order to perform an external data verification.

The process flow then moves to process block 260. At process block 260, the host 22 sends another read command to the command user interface 40 over lines 26. This causes host 22 to read the second data word in the data stream from flash memory array 20 over data bus 104. In process block 260, host 22 also sends the address of the data word to be read over address bus 102 to flash memory 24. At process block 260, the write state machine 28 and special programming mode circuitry 32 of flash memory 24 perform a read operation with respect to the second data word using margined voltage sensing levels, and send the second data word over data bus 104 to host processor 22.

Process flow then moves to process block 262. At process block 262, host 22 performs a verification (i.e., comparison) of the second data word with respect to the data word intended to be programmed. This is done to check whether the data word was successfully programmed in data array 20.

The process flow continues. The host 22 reads the next data word by sending a read command to flash memory array 24 along with an address. The flash memory 24 responds by performing a read at a margined-sensing level and sending the read data word to host processor 22 via lines 26. The host processor 22 then performs a verification with respect to that next data word.

The process flow continues. Finally, at process block 270 the host processor 22 reads the last data word in the data stream. At process block 270, host processor 22 sends a read command and an address to memory array 24. Flash memory 24 responds by reading the last data word using a margined voltage and sends that last data word over lines 26 to host processor 22. Process flow then moves to process block 272. At process block 272, host processor 22 verifies that last data word by performing a comparison with respect to the last data word from the data stream stored in memory 34.

The external verification procedure 250 then moves to process block 274. At process block 274, host processor 22 checks whether all the words in the data stream successfully compared during the external verification process supervised by host processor 22. If all the data words successfully compared to the data words intended to be programmed into flash memory 24, then process flow moves to process block 276, at which point the external verification procedure ends.

If at process block 274 host processor 22 concludes that all the words did not successfully compare as part of the external verification, then process flow moves to process block 278. At process block 278, host processor 22 reprograms the failed data words. This is done by host processor 22 sending a data stream setup command over lines 26 to command user interface 40 of flash memory 24. This is shown in FIG. 7 by the movement from state 158 to state 154. The host processor 22 then sends the data word with an address to flash memory 24 over lines 26. This causes the command user interface 40 to go from state 154 to state 156. At state 156, failed data words are reprogrammed into flash memory array 20 in a streaming fashion. If there is only one failed data word, then only that failed data word is reprogrammed into flash memory array 20 at the respective address.

Host processor 22 then sends the data stream termination trigger to flash memory 24. The command user interface 40 then jumps from state 156 to state 152. The process flow for external verification 250 shown in FIG. 9 then moves to process block 280. At process block 280, the host processor 22 performs an external read and verification of the reprogrammed words. In particular, the host processor 22 sends a read array command to the command user interface 40 via lines 26. The command user interface then moves from state 152 to state 158, shown in FIG. 7. The host processor 22 sends a read command with respect to each reprogrammed data word. The flash memory array 24 reads the reprogrammed data words at the margined-sensing level and sends those data words to host memory 22 via lines 26. Host processor 22 then verifies (i.e., compares) each data word as it is received to the expected data word stored in scratch pad memory 34.

Process flow then moves to process block 282 shown in FIG. 9. At process block 282, the host processor 22 checks whether any of the reprogrammed words did not verify and thus still failed the external verification test. If any of the reprogrammed data words still failed, then process flow moves to step 286. At step 286 host processor 22 notes an error with respect to the programming of flash memory 24. In other words, at step 286, the host processor indicates that the flash memory 24 failed the test done as part of the special programming mode.

For an alternative embodiment of the invention, if all the words did not successfully compare at process block 274, then the host processor 22 would exit the special programming mode and attempt to reprogram the failed data words using normal programming techniques involving internal verification by flash memory 24. As part of that reprogramming, flash memory 24 would apply multiple programming pulses for each word in order to attempt to program those words. If for that alternative procedure the reprogrammed words are not successfully reprogrammed, then flash memory 24 would indicate in status register 83 the failure to reprogram those data words.

If, however, at process block 282 the host computer determines that all of the reprogrammed words correctly verified and that none failed to be properly programmed, then process flow moves to process block 284. At process block 284, the host processor indicates that the testing of the flash memory array with respect to the programmed stream of data words has ended successfully.

During the special programming mode, if any invalid command is received by the command user interface 40, then the command user interface 40 always moves to state 158, which is the read array state.

Once the host processor has completed all its testing during the special programming mode, the host processor will want to exit the special programming mode. The host processor 22 may wish to exit the special programming mode whether or not flash memory 24 passed or did not pass the various programming tests done by host processor 22.

In order to exit the special programming mode, host processor 22 sends an exit special programming mode command to flash memory 24 via lines 26. The exit special programming mode command is received by the command user interface 40 of flash memory 24. The command user interface then enters state 160. In state 160, the command user interface is in the status state. At state 160, the output multiplexer 45 outputs a status signal. At state 160, the flash memory array 24 is no longer in the special programming mode. Once the flash memory array is no longer in the special programming mode, the flash memory array 24 can perform its usual internal program verification operations.

For one embodiment of the invention, the special programming mode can be permanently disabled with respect to flash memory 24. For one embodiment, this is done after a flash memory 24 successfully completes the programming test during the special programming mode. The special programming mode is disabled so that a customer purchasing the flash memory 24 is unable to enter the special programming mode. In other words, for that embodiment, the special programming mode is a special factory programming mode used exclusively for factory testing.

In order to permanently disable the special programming mode, referring to FIG. 7, the process flow moves to state 162. At state 162, the host processor 22 sends a disable special programming mode command to the command user interface 40 over lines 26. Process flow then moves to process block 164. At process block 164, the flash memory 24 permanently disables the special programming mode. In particular, at process block 164, the write state machine 28 and special programming mode circuitry 32 set an internal register or CAM (content addressable memory) that prevent the write state machine 28 and special programming mode circuitry 32 from ever further entering the special programming mode. When the special programming mode is permanently disabled, the end-user then can no longer enter the special programming mode. That means that even if a host computer 22 were to send a special programming mode command to the flash memory 24, the write state machine and circuitry 32 would not allow the flash memory array to enter the special programming mode. With the special programming mode disabled, programming of the flash memory array would occur in its normal mode, which would include internal program verification for each programming of a data word.

For an alternative embodiment, this special programming mode can be semi-permanently disabled by setting a bit in code that controls circuitry 32 and write state machine 38. For that alternative embodiment, certain command sequences could be used to alter the disabling of the special programming mode. Those command sequences would not be told to the user, but only known to the manufacturer of the flash memory. For yet another alternative embodiment, the disable circuitry with respect to the special programming mode, although located in a register or CAM, could be accessed by the manufacturer and altered even once the bit or register is set to permanently disable the special programming mode.

For one embodiment, entering a special programming access code into the command user interface 40 enables the special programming mode of the memory. As will be described in more detail below, multiple words are then programmed into the memory. Because the special programming mode is enabled, the internal verification is disabled. The special programming mode of the memory is then exited.

Figure 9A:
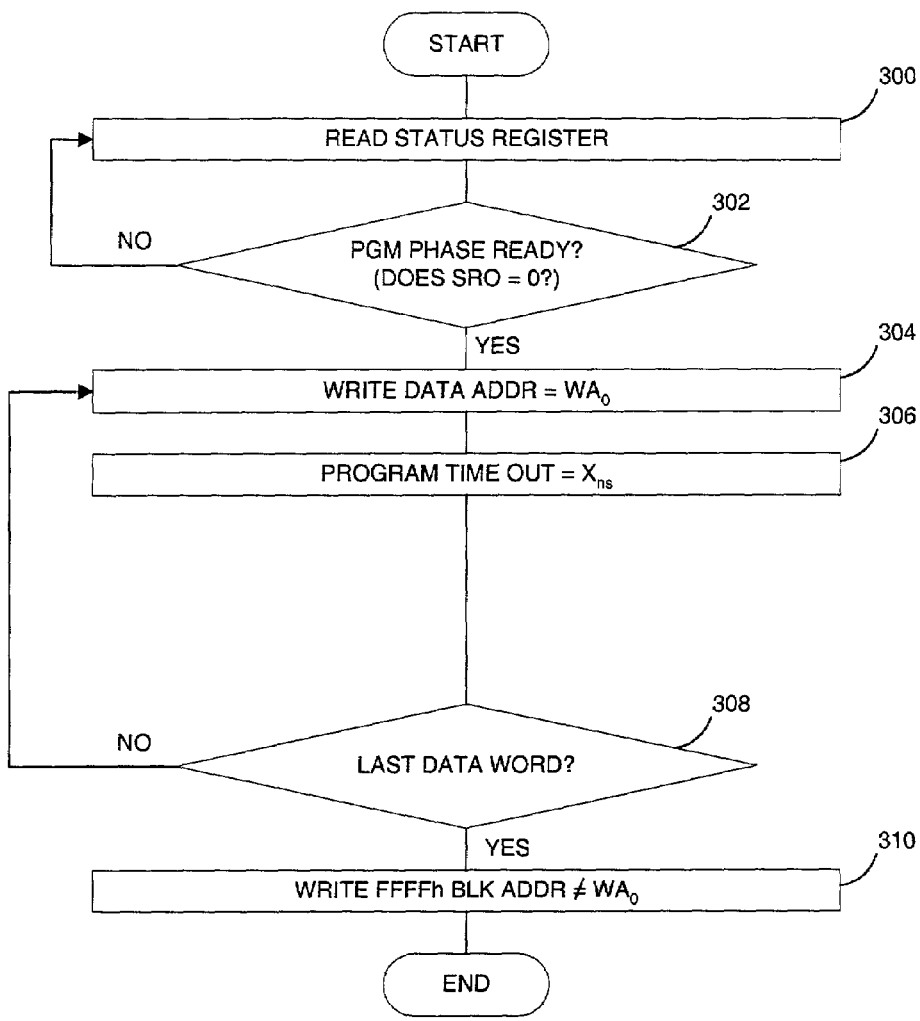
FIG. 9A illustrates an alternative programming sequence of one embodiment.

FIG. 9A illustrates an alternative programming sequence of one embodiment. First the status register is read at process block 300. For one embodiment, when the status register reads 0, then the program (PGM) phase is ready to begin as shown in process block 302. Next, the data is written to the memory in process block 304. The data is sent continuously until a program time ($X_{ns}$) has expired (i.e. timed out) as shown in process block 306. Next, the last data word is checked in process block 308. If the last data word was not sent to the memory, then the program process repeats as shown in process blocks 304, 306. If the last data word was sent to the memory, then the program phase is ended by writing FFFF in the block address as shown in process block 310.

Figure 9B:
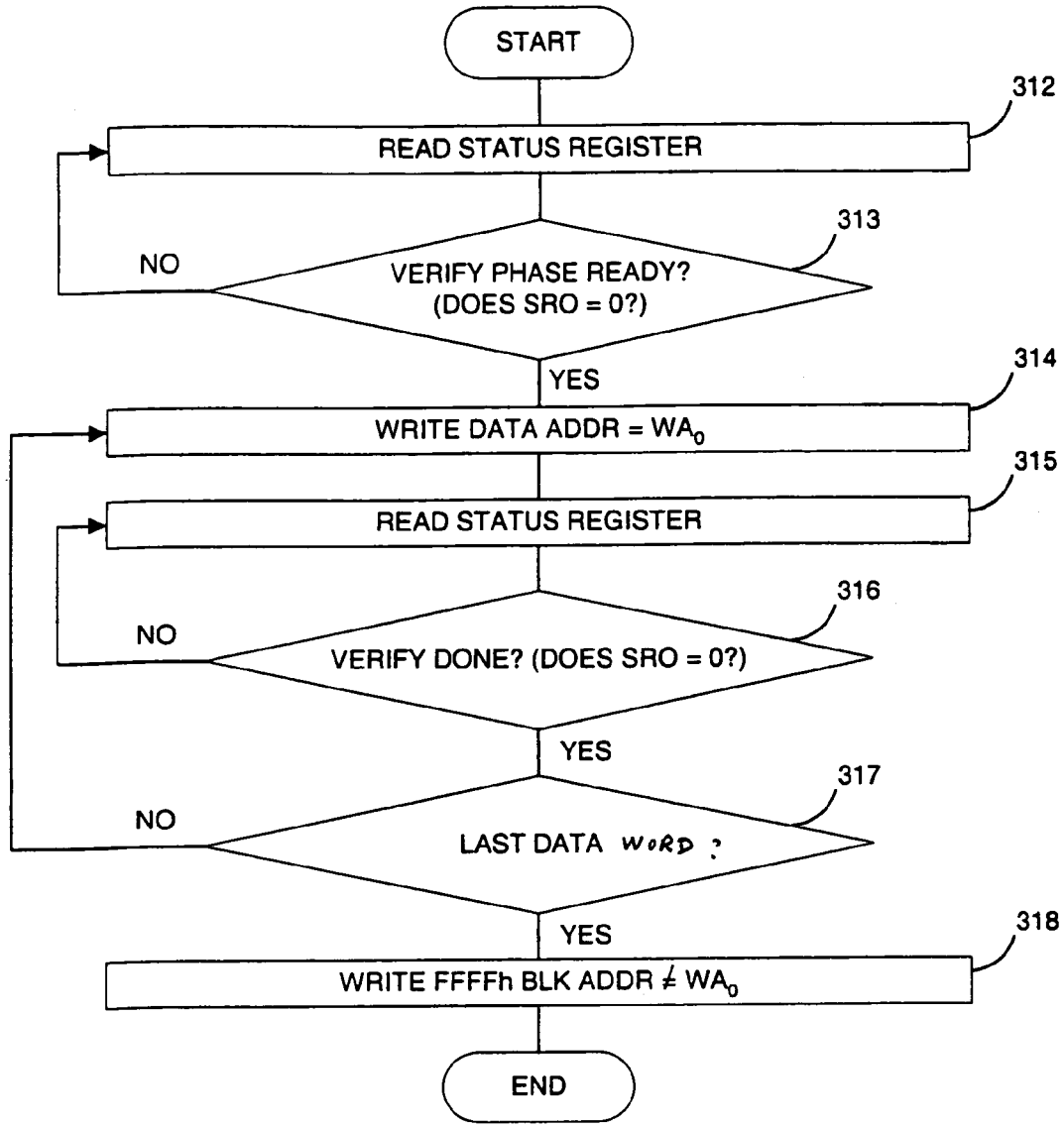
FIG. 9B illustrates an alternative verification sequence of one embodiment.

FIG. 9B illustrates an alternative verification sequence of one embodiment. The verification may be accomplished either by an external verification processor or by the verification processor internal to the memory, if enabled. First, the status is checked in process blocks 312, 313 to determine if verification phase is ready. Next, the same data words sent during the program phase are resent to the memory in process block 314 and the resent data words are compared to the data words sent to the memory during the program phase. For an alternative, the data words may be sent to both the memory and a second memory during the program phase. For one embodiment, if any one of the words does not verify during the verification step 314, then the entire block of words are reprogrammed into the memory as described above. The verification is then repeated. For an alternative embodiment, if any one of the words does not verify during the verification step 314, then the one word that did not verify must be reprogrammed and verification repeated. Next, the status is checked in process blocks 315, 316 to determine if verification phase is done. If the last data word was verified, then the program phase is ended by writing FFFF in a different address as shown in process block 318.

Figure 10:
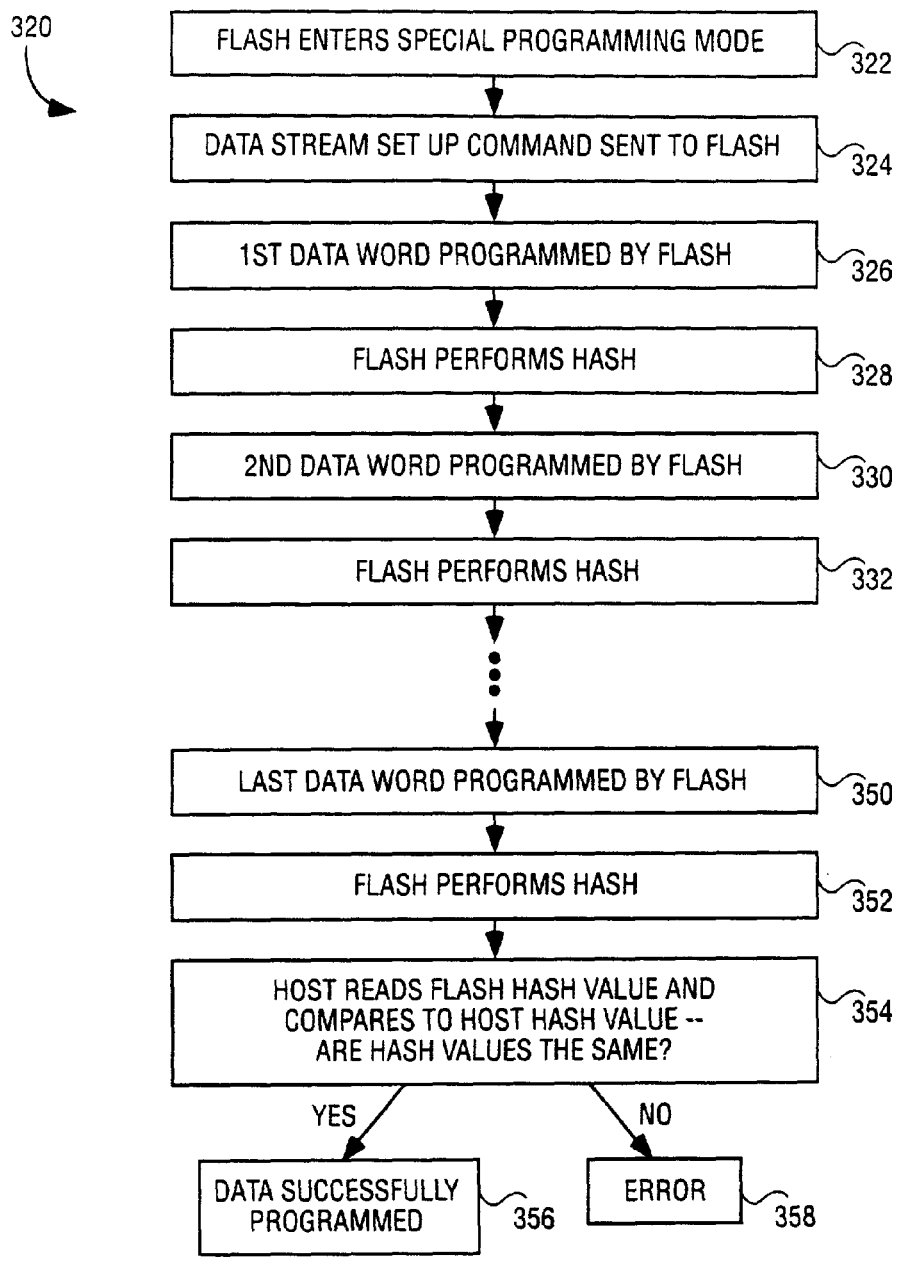
FIG. 10 shows the programming and verification procedures for a special programming mode that includes hashing.

FIG. 10 shows programming and verification procedures 320 for a special programming mode that includes hashing. For the operation 320 shown in FIG. 10, the process flow shown in FIG. 7 generally applies, except for the addition of hashing by flash memory 24.

For operations for procedure 320, there is a hash operation associated with each data word rather than a verification associated with the reading of each data word. At the end of the programming of the data stream, there is a single verification step involving the comparison of hash values.

As shown in FIG. 10, the program flow for procedure 320 starts at process block 322. At process block 322, flash memory array 24 enters the special programming mode. Thus flash memory array 24 enters the special programming mode state 152 by the host processor sending in a special programming command to flash memory device 24.

The process flow moves to process block 324. At process block 324, the data stream setup command is sent to flash memory array 24 via lines 26 by host processor 22. Thus, state 154 is entered.

Process flow moves to process block 326, at which host processor 22 sends the first data word in a data stream to flash memory 24 via lines 26 for programming into array 20. The state of the command user interface 40 moves to state 156, which is the data streaming state. At state 156, the flash memory receives a stream of data words that are programmed into flash memory array 20. For one embodiment, the stream of data words does not require sequential addresses. For another embodiment, the stream of data words is for sequential addresses.

The process flow moves to process block 328, at which the flash memory array performs a hash with respect to the first data word that has been programmed. The hash performed at process block 328 is a dynamic hash because it is performed with respect to each data word programmed into flash memory array 20. In other words, the hash is performed one word at a time.

At process block 328, the write state machine 28 and the special programming mode circuitry 32 perform a hash by running the first data word through a hashing algorithm that distills the data into a smaller data word that is the output of the hashing algorithm. The write state machine 28 and circuitry 32 temporarily store the hash value produced in process block 328 at a location within flash memory array 20. Array 20 also stores the hash algorithm. For an alternative embodiment of the invention, the write state machine 28 and circuitry 32 store the hash algorithm in microcode within the write state machine 28.

Process flow then moves to process block 330. At process block 330, a second data word is programmed into the flash memory array 20. This is the second data word of the data stream.

Process flow moves to process block 332, at which the flash memory 24 performs a hash operation with respect to a second data word that has been programmed in conjunction with the hash of the first data word. In other words, the hash algorithm receives as inputs both the result of the first hashing operation and the second data word. The hashing algorithm outputs a hashing intermediate output, which is stored in flash memory array 20.

The process flow for procedure 320 continues for the next series of data words within the data stream. Each data word is programmed into flash memory array 20. Flash memory array 24 performs a dynamic hashing with respect to each programmed data word. The hashing algorithm uses the new programmed data word and the result of the previous hashing operation to create a new hash value, and the result is stored in array 20. The process flow for procedure 320 continues to process block 350, at which the last word in the stream is programmed into array 20 by the flash memory 24. At process block 352, the write state machine and special programming mode circuitry 32 cause the hash algorithm to perform a hash operation with respect to the last data word programmed by the flash memory and the previous output of the hashing algorithm. The resulting hash value is stored in array 20.

The process flow then moves to process block 354. At process block 354, the host processor 22 compares the hash value stored in flash memory array 20 with a hash value that the host processor 22 had stored in memory 34 to see if they are the same. The hash value stored in memory 34 is a result of a dynamic hashing of the data stream words stored in memory 34 that were sent by host processor 22 for programming into flash memory 24. In other words, host processor 22 executes the same hashing algorithm as flash memory 24 with respect to the data words to be programmed into flash memory 24. If the hash values stored in array 20 and memory 34 are the same, then process flow moves to process block 356, which means that the data words in the data stream have all been successfully programmed into flash memory 24. That is because a hash operation means that there is a high likelihood that the result of the hash operation is a unique number. There would only be an extremely small possibility that the hash values would be the same even though the data stream words had not been successfully programmed into flash memory 24. If the hash values are the same at process block 354, there is a high probability that the data stream was successfully programmed into flash memory 24.

Once the hashing technique or procedure 320 is completed, host processor 22 would cause the flash memory 24 to exit the special programming mode.

If at process block 354 host processor 22 determines that the hash values are not the same, then process flow moves to process block 358, at which point host processor 22 indicates an error in the programming of flash memory 24. If the hash values are not the same, it is highly likely that one or more of the data words was not successfully programmed into flash memory 24.

For one embodiment of the invention, if an error condition is indicated at process block 358, then the hashing process flow for procedure 320 is repeated for all the data words of the data stream.

For an alternative embodiment of the invention, if an error is indicated in process block 358, then the special programming mode is exited and host processor 22 attempts to reprogram flash memory 24 using normal programming techniques that involve internal program verification by flash memory 24.

For an alternative embodiment of the invention, process flow for procedure 320 could include the hashing of status information stored within flash memory 24 in addition to the hashing of the programmed data words dynamically. The status information could include the status value stored in status register 83 as well as other status information. Host processor 22 would store in its memory 34 an expected hash value that would result from the hashing of the data stream words and expected status information from flash memory 24. The hashing of status information in addition to data words would allow the host processor 22 to check for correct operation by flash memory 24 in addition to the correct programming of the data stream. For example, if a blocking error occurred, the alternative hashing procedure might capture that error. If status information and data words are hashed, the write state machine 28 and the special programming mode circuitry 32 would oversee the running of the hash algorithm.

Figure 11:
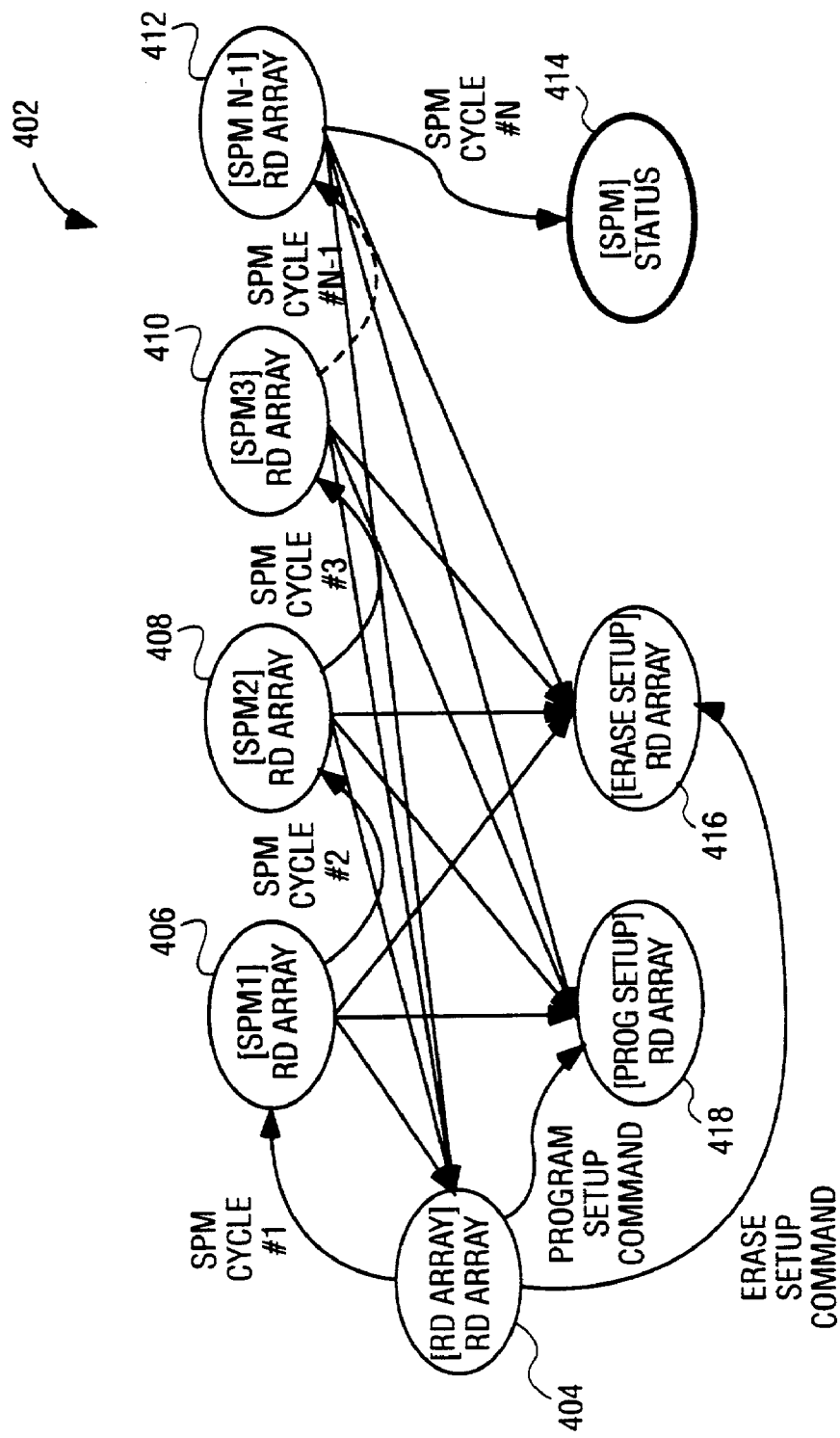
FIG. 11 shows an alternative procedure for entering the special programming mode.

FIG. 11 illustrates an alternative procedure 402 for entering the special programming mode. Rather than using a single special programming mode command sent from host processor 22 to flash memory 24, the procedure 402 uses a command sequence that an end user is unlikely to follow. Thus, procedure 402 makes it less likely that an end user would enter the special programming mode. A manufacturer would keep the procedure 402 confidential and use such a procedure for factory testing of the flash memory 24, for example.

The special sequence 402 operates as follows. Host processor 22 sends a read array command to command user interface 40 over lines 26, which causes flash memory 24 to enter state 404. At state 404, the command user interface is in the read array state and output multiplexer 45 outputs a read array signal. At state 404, the flash memory 24 is not in the special programming mode. If the host processor 22 sends a program setup command to the command user interface 40, the process flow moves to state 418, wherein command user interface 40 is in the program setup mode and the output multiplexer 45 outputs a read array signal. Alternatively, if process flow starts at state 404 and the host processor 22 sends an erase setup command to the command user interface 40 then command user interface 40 moves to state 416, wherein the command user interface 40 is in the erase setup state and the output multiplexer 45 outputs a read array signal.

If process flow starts at state 404, then in order to enter the special programming mode, host processor 22 sends a series of special programming mode commands to the flash memory 24 on sequential bus cycles of bus or lines 26. When the first special programming mode command is sent by host processor 22, the command user interface 40 enters state 406, which is a special programming mode number 1 state and the output multiplexer indicates a read array signal.

If the command user interface 40 is in special programming mode state number 1, which is process block 406, the receipt of another special programming mode command causes the command user interface 40 to go to state 408, which is the special programming mode number 2 state, with the output multiplexer 45 outputting a read array signal. Another special programming mode command sent by the host processor 22 to the command user interface 40 causes a jump to state 410, which is a special programming mode number 3 state for command user interface 40, with the output multiplexer 45 outputting a read array signal.

Other sequential special programming mode commands cause similar states to be assumed by command user interface 40. If n−1 special programming mode commands are sent, the state 412 is entered by the command user interface 40. At state 412, the command user interface 40 is in the special programming mode n−1 state, and the output multiplexer 45 outputs a read array signal.

At states 406, 408, 410, and 412, the flash memory 24 is not, however, in the true special programming mode. When command user interface 40 is in states 406, 408, 410, and 412, the receipt by command user interface 40 of a non-special programming mode command can cause the command user interface to enter a normal state, such as a read array state 404, a program setup state 418, or an erase setup state 416, for example. In other words, the special programming mode has not been entered.

If, however, once the command user interface is in state 412 and another special programming mode command is received on the nth bus cycle, then the command user interface jumps to state 414, which is the special programming mode. At state 414, the command user interface is in the true special programming mode state and output multiplexer 45 outputs a status signal.

For the process flow 402 of FIG. 11, the host processor sends the required sequence of special programming mode commands to get the flash memory into state 414, which is the special programming mode state. Once the command user interface 40 and the flash memory 24 are in state 414, they remain in the special programming mode state until the host processor 22 sends an exit special programming mode command to cause the flash memory to go to state 160 of FIG. 7, which is the status state of command user interface 40.

Thus, the true special programming mode state is only entered if a series of n special programming mode commands are sent sequentially in the bus cycles. For one embodiment of the invention, the integer "n" is ten, which means ten special programming mode commands. Other values of n are possible, however.

For the alternative embodiment shown in FIG. 11, the host processor 22 can send a disable special programming mode command to flash memory 24 after the special programming mode has been exited to disable the procedure 402 from ever in the future causing the flash memory 24 enter the special programming mode. In other words, the host processor 22 can send a disable special programming mode command that would permanently disable the special programming mode.

Alternatives with respect to the procedure 402 are possible. Additional cycling or complex procedures could be added to help prevent a user from hacking into the special programming mode. Thus, further complexity could be added to the special programming mode command sequence to further increase the difficulty of entering the special programming mode. Such further security might be used if the special programming mode was not permanently disabled. For example, a manufacturer of flash memory 24 might not want to permanently disable the flash special programming mode because the manufacturer wants to use the special programming mode to troubleshoot flash memory 24 after flash memory 24 is used in the field by customers. A complex procedure for entering the special programming mode would allow help to prevent a user from intentionally or accidentally entering the special programming mode, but would still allow an informed manufacturers representative to follow the proper procedures for entering the special programming mode.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising:
    enabling a special programming mode of a memory by entering a special programming access code in a state controller, wherein the memory includes automation circuitry for internal program verification and wherein enabling special programming mode disables the internal program verification by the automation circuitry of the memory;
    programming with a single command a plurality of words into the memory during the special programming mode without having the automation circuitry of the memory to perform the internal program verification;
    exiting the special programming mode of the memory after the plurality of words have been programmed into the memory;
    permanently disabling the special programming mode in response to exiting the special programming mode; and
    enabling the internal program verification of the memory after exiting the special programming mode, wherein one or more words subsequently programmed into the memory are verified by the internal program verification performed by the memory.

2. The method of claim 1, further comprising verifying the plurality of words programmed into the memory by a verification processor externally coupled to the memory during the special program mode of the memory.

3. The method of claim 2, wherein the verifying further includes:
    determining if all of the words in the plurality of words are verified;
    if any one of the plurality of words does not verify, then repeating the programming of the entire plurality of words and repeating the verifying by the verification processor; and
    if all of the plurality of words verify, then exiting the special programming mode of the memory.

4. The method of claim 2, wherein the verifying further includes:
    determining if all of the words in the plurality of words are verified;
    if any one of the plurality of words does not verify, then repeating the programming of the word that did not verify and repeating the verification by the verification processor; and
    if all of the plurality of words verify, then exiting the special programming mode of the memory.

5. The method of claim 1, wherein upon exiting the special programming mode of memory, internal program verification by the memory is enabled.

6. The method of claim 1, wherein the programming of the plurality of words into the memory comprises using only a single programming pulse for each bit of each word of the plurality of words.

7. The method of claim 1, wherein the programming of the plurality of words into the memory without the memory performing internal program verification continues until a programming ending condition is met.

8. The method of claim 7, wherein the programming ending condition is a preselected time.

9. The method of claim 7, wherein the programming ending condition is an ending address.

10. An apparatus comprising:
a first memory having an automation circuitry to perform internal program verification unless the automation circuitry is disabled, the automation circuitry including a special programming mode circuitry to disable the automation circuitry that performs the internal program verification when the special programming mode circuitry is enabled; and
a host processor communicatively coupled to the first memory, the host processor to:
send with a single command to the first memory a first plurality of words to be programmed into the first memory without the first memory performing the internal program verification during the special programming mode;
exit the special programming mode of the first memory after the first plurality of words have been programmed into the first memory;
permanently disable the special programming mode in response to exiting the special programming mode; and
enable the internal program verification of the first memory after exiting the special programming mode, wherein one or more words subsequently programmed into the first memory are verified by the internal program verification performed by the first memory.

11. The apparatus of claim 10, wherein the host processor further verifies the first plurality of words programmed into the first memory without having the first memory to perform the internal verification.

12. The apparatus of claim 11, wherein the host processor, without
invoking the internal program verification performed by the first memory,
reads back from the first memory the first plurality of words that have been programmed into the first memory, and
compares a second plurality of words stored in a second memory coupled to the host processor with the first plurality of words read back from the first memory to verify whether the first plurality of words have been programmed into the first memory successfully, the second memory being separated from the first memory and external to the first memory.

13. The apparatus of claim 12, wherein the host processor further reprograms the entire first plurality of words into the first memory if any one of the first plurality of words is not verified successfully by the host processor.

14. The apparatus of claim 12, wherein the host processor further reprograms one or more of the first plurality of words into the first memory that did not verify successfully without reprogramming a remainder of the first plurality of words that verifies successfully.

15. The apparatus of claim 10, wherein the host processor disables the special programming mode circuitry when exiting the special program mode of the first memory.

16. The apparatus of claim 10, wherein the special programming mode circuitry is disabled when a programming ending condition is met.

17. The apparatus of claim 16, wherein the programming ending condition is a pre-selected time.

18. The apparatus of claim 16, wherein the programming ending condition is an ending address.

* * * * *